US009298232B2

(12) United States Patent
Matsumoto et al.

(10) Patent No.: US 9,298,232 B2
(45) Date of Patent: Mar. 29, 2016

(54) ELECTRONIC DEVICE

(71) Applicant: Kabushiki Kaisha Toshiba, Tokyo (JP)

(72) Inventors: Yasuo Matsumoto, Tokyo (JP);
Toshikatsu Nakamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 236 days.

(21) Appl. No.: 14/015,898

(22) Filed: Aug. 30, 2013

(65) Prior Publication Data

US 2014/0185223 A1     Jul. 3, 2014

Related U.S. Application Data

(63) Continuation of application No. PCT/JP2013/058411, filed on Mar. 22, 2013.

(30) Foreign Application Priority Data

Dec. 28, 2012   (JP) .................. 2012-288063

(51) Int. Cl.
*G06F 1/20*         (2006.01)
*H05K 7/20*         (2006.01)
(Continued)

(52) U.S. Cl.
CPC   *G06F 1/203* (2013.01); *G06F 1/20* (2013.01); *H01L 23/467* (2013.01); *H05K 7/20* (2013.01);
(Continued)

(58) Field of Classification Search
CPC ....... G06F 1/20; G06F 1/203; H05K 7/20718; H05K 7/20; H05K 7/20009; H05K 7/20136; H05K 7/20145; H05K 7/20172; H01L 23/467

USPC .................. 361/678, 679.46, 679.47, 679.48, 361/679.49, 679.5, 690, 692, 694, 695; 174/15.1; 257/721, E23.099; 165/80.3
See application file for complete search history.

(56) References Cited

U.S. PATENT DOCUMENTS 7,145,771 B2 *  12/2006  Wang ........................... 361/695
8,144,477 B2    3/2012   Hamada
(Continued)

FOREIGN PATENT DOCUMENTS

| JP | 11-251772 A   | 9/1999 |
| JP | 2000-208955 A | 7/2000 |
| JP | 2003-124667 A | 4/2003 |
| JP | 2011-081437 A | 4/2011 |
| JP | 2011-134188 A | 7/2011 |

OTHER PUBLICATIONS

International Search Report dated May 14, 2013 of PCT/JP2013/058411 which is the parent application in 2 pages.

*Primary Examiner* — Hoa C Nguyen
*Assistant Examiner* — Binh Tran
(74) *Attorney, Agent, or Firm* — Knobbe, Martens Olson & Bear LLP

(57) ABSTRACT

According to one embodiment, an electronic device includes: a first housing including a first wall; a reinforcing member that is overlapped on an inner surface of the first wall and is bonded to the first wall; an electric component including a second wall located at a side opposite to the first wall with respect to the reinforcing member, a third wall located at a side opposite to the reinforcing member with respect to the second wall and spaced from the second wall, and a fourth wall connecting the second wall and the third wall, the electric component being accommodated in the first housing, and a first protrusion that is provided to the reinforcing member and projects toward the fourth wall.

8 Claims, 6 Drawing Sheets

(51) Int. Cl.
*H01L 23/467* (2006.01)
*H05K 5/00* (2006.01)
(52) U.S. Cl.
CPC ............................... *H05K 7/20009* (2013.01); *H05K 7/20136* (2013.01); *H05K 7/20145* (2013.01); *H05K 7/20172* (2013.01); *H05K 7/20718* (2013.01)

(56) References Cited

U.S. PATENT DOCUMENTS

| | | | |
|---|---|---|---|
| 8,379,383 B2 | 2/2013 | Sugiura et al. | |
| 2005/0276018 A1* | 12/2005 | Moore et al. | 361/695 |
| 2011/0080710 A1 | 4/2011 | Sugiura et al. | |
| 2011/0157794 A1 | 6/2011 | Hamada | |

* cited by examiner

ELECTRONIC DEVICE

CROSS-REFERENCE TO RELATED APPLICATIONS

This application is a continuation of PCT international application Ser. No. PCT/JP2013/058411 filed Mar. 22, 2013 which designates the United States, incorporated herein by reference, and which claims the benefit of priority from Japanese Patent Application No. 2012-288063, filed Dec. 28, 2012, the entire contents of which are incorporated herein by reference.

FIELD

Embodiments described herein relate generally to an electronic device.

BACKGROUND

Conventionally known has been an electronic device in which a housing accommodates an electric component such as a fan.

In the electronic devices of this type, it is desired that deformation of the housing is suppressed when it receives an external force.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
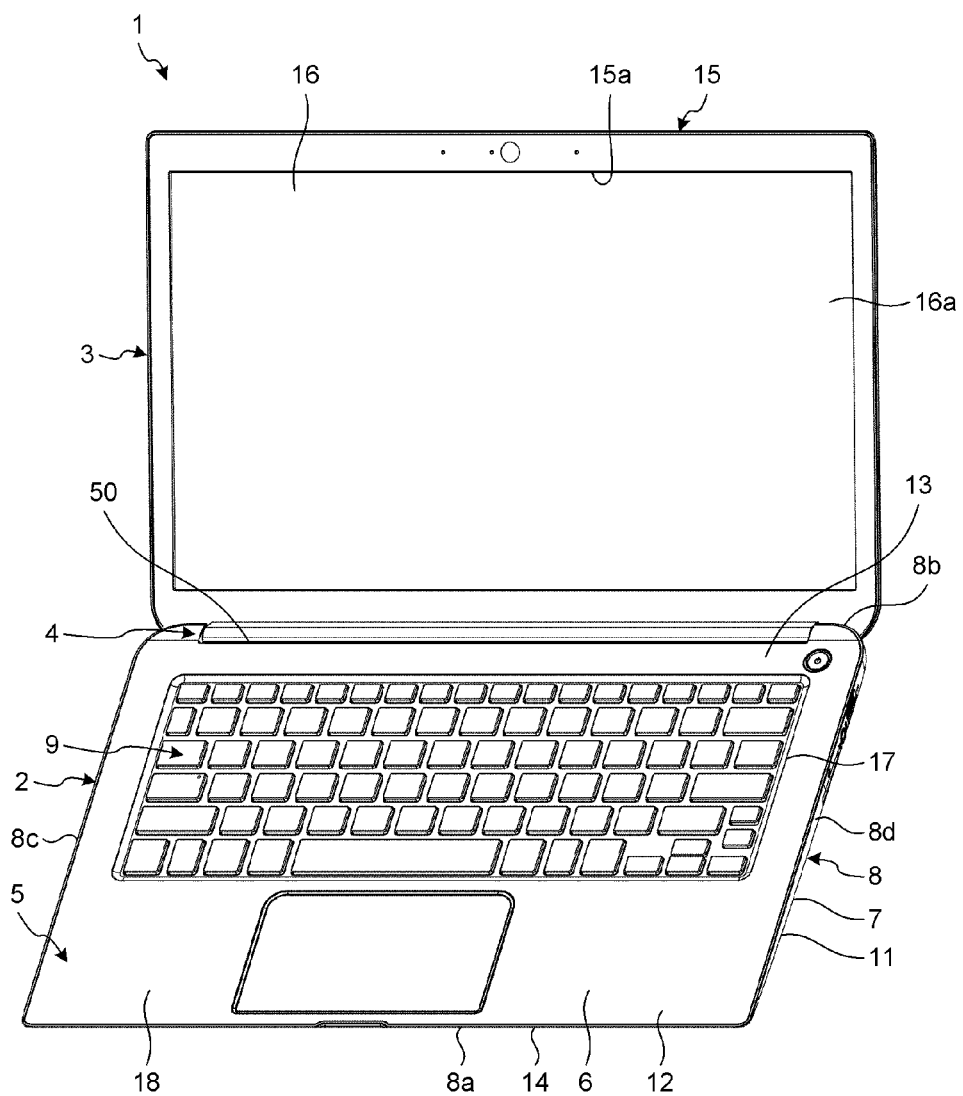
FIG. 1 is an exemplary perspective view illustrating an example of an electronic device according to a first embodiment.

In general, according to one embodiment, an electronic device comprises: a first housing comprising a first wall; a reinforcing member that is overlapped on an inner surface of the first wall and is bonded to the first wall; an electric component comprising a second wall located at aside opposite to the first wall with respect to the reinforcing member, a third wall located at a side opposite to the reinforcing member with respect to the second wall and spaced from the second wall, and a fourth wall connecting the second wall and the third wall, the electric component being accommodated in the first housing, and a first protrusion that is provided to the reinforcing member and projects toward the fourth wall.

Hereinafter, described are embodiments in detail with reference to the accompanying drawings. In the following plurality of embodiments, the same constituent components are comprised. Common reference numerals denote these same constituent components and overlapped description is omitted below.

First Embodiment

An electronic device 1 as illustrated in FIG. 1 is constituted as a notebook personal computer (hereinafter, referred to as notebook PC), for example. The electronic device according to the embodiment is not limited thereto. For example, the electronic device according to the embodiment can be constituted as a television receiver, a recording/reproduction device, a personal digital assistant (PDA), a game machine, and the like.

As illustrated in FIG. 1, the electronic device 1 comprises a main body unit 2, a display unit 3, and a hinge 4.

The main body unit 2 is an electronic device main body mounted with a main board. The main body unit 2 comprises a housing 5. The housing 5 has an upper wall 6, a lower wall 7, and a peripheral wall 8, and is formed into a flattened box shape. The housing 5 is an example of a first housing and the lower wall 7 is an example of a first wall.

The lower wall 7 faces the upper surface of a table when the electronic device 1 is placed on the table. The lower wall 7 is substantially parallel with the upper surface of the table. The upper wall 6 is spread in substantially parallel with (that is, substantially horizontal to) the lower wall 7 so as to be spaced from the lower wall 7. A keyboard 9 is attached to the upper wall 6. The peripheral wall 8 is erected from the lower wall 7 and connects the peripheral edge portion of the lower wall 7 and the peripheral edge portion of the upper wall 6.

The housing 5 comprises a base 11 and a cover 12. The base 11 comprises the lower wall 7 and a part of the peripheral wall 8. The base 11 (lower wall 7) can be made of magnesium, as an example. The cover 12 comprises the upper wall 6 and a part of the peripheral wall 8. The cover 12 is combined with the base 11 so as to constitute the housing 5.

Figure 2:
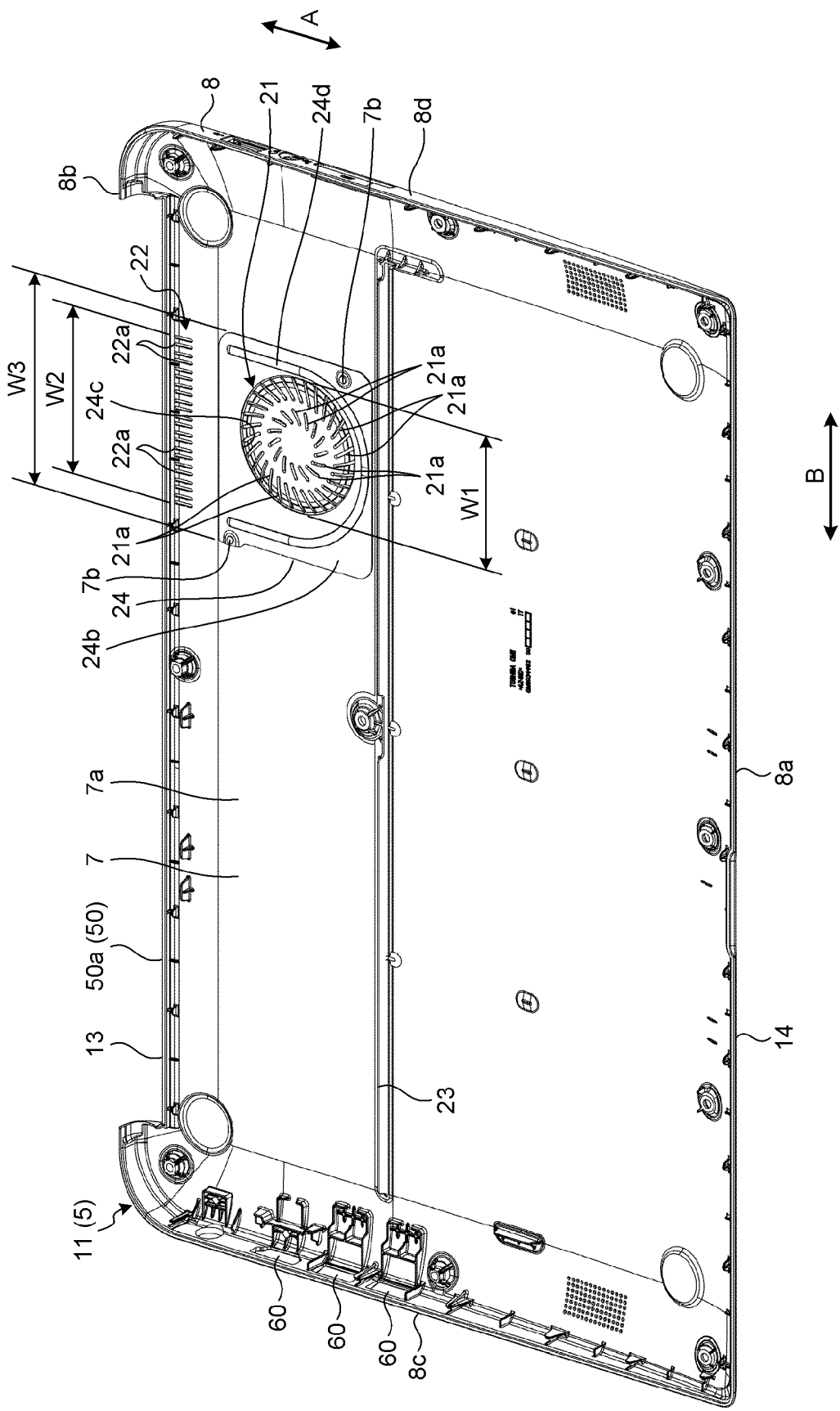
FIG. 2 is an exemplary perspective view illustrating an example of the inner side of a lower wall of a main body unit of the electronic device in the first embodiment.

The housing 5 has a rear end portion 13 (first end portion) and a front end portion 14 (second end portion). The display unit 3 is coupled to the rear end portion 13 in a rotationally movable manner. The front end portion 14 is located opposite to the rear end portion 13. The peripheral wall 8 has a front wall 8a, a rear wall 8b, a left wall 8c, and a right wall 8d. The front wall 8a extends in the width direction (right-left direction) of the housing 5 on the front end portion 14. The rear wall 8b extends in the width direction of the housing 5 on the rear end portion 13. The left wall 8c and the right wall 8d extend in the depth direction (front-rear direction) of the housing 5 and connect the end portion of the front wall 8a and the end portion of the rear wall 8b. The housing 5 is provided with an accommodation portion 50 accommodating the hinge 4. The accommodation portion 50 is provided to the rear end portion 13. The accommodation portion 50 is formed in a recess form toward the front end portion 14 of the housing 5. As illustrated in FIG. 2, an accommodation portion 50a as a part of the accommodation portion 50 is provided to the lower wall 7.

As illustrated in FIG. 1, the display unit 3 is coupled to the rear end portion 13 of the main body unit 2 by the hinge 4 in a rotationally movable manner (openable and closing manner). The display unit 3 is rotationally movable between a closed position (FIG. 5) at which it is laid so as to cover the main body unit 2 from the upper side and an opened position (FIG. 1) at which it is erected from the main body unit 2.

The display unit 3 comprises a display housing 15 and a display panel 16 accommodated in the display housing 15. The display housing 15 is coupled to the housing 5 by the hinge 4 in a rotationally movable manner. A display screen 16a of the display panel 16 can be exposed to the outside through an opening 15a provided to a front wall of the display housing 15. The display housing 15 is an example of a second housing.

As illustrated in FIG. 1, the upper wall 6 comprises a keyboard placement portion 17 to which the keyboard 9 is attached and a palm rest 18. The palm rest 18 is provided at the front side relative to the keyboard placement portion 17, that is, between the keyboard placement portion 17 and the front wall 8a.

Figure 3:
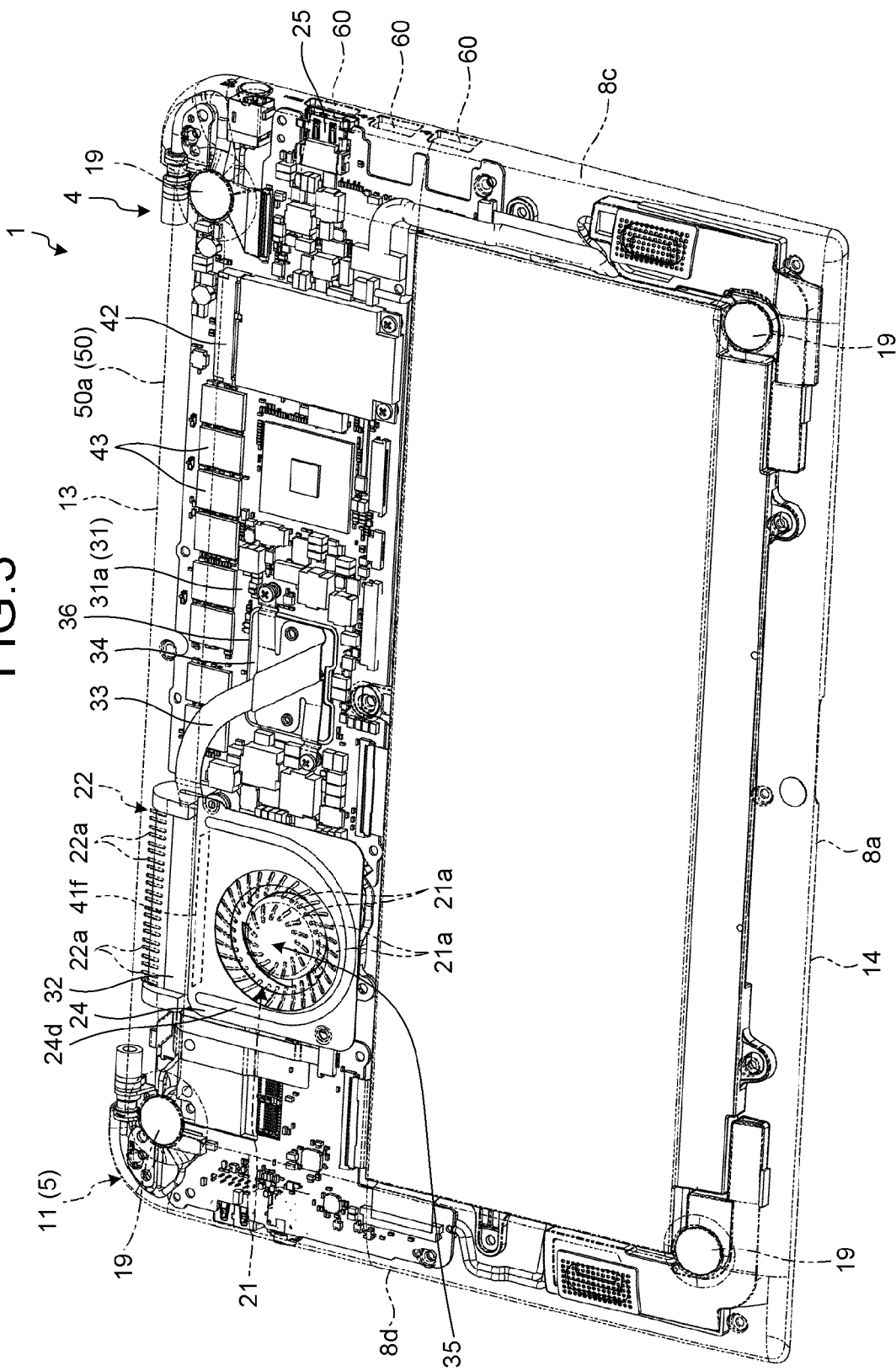
FIG. 3 is an exemplary transparent perspective view illustrating an example of the main body unit of the electronic device in the first embodiment when seen from the lower side.

As illustrated in FIG. 2 and FIG. 3, the housing 5 has a suction port 21 (suction portion) and an exhaust port 22 (exhaust portion). The suction port 21 is an example of a first opening and the exhaust port 22 is an example of a third opening. The suction port 21 is provided to the lower wall 7. The suction port 21 is located at the lower side of a fan 35, which will be described later, so as to face the fan 35. The suction port 21 is constituted by a plurality of through-holes 21a (holes) provided to the lower wall 7, as an example. The through-holes 21a are aligned in a dual ring form, as an example. The exhaust port 22 is provided to the lower wall 7. The exhaust port 22 is constituted by a plurality of through-holes 22a (holes) provided to the lower wall 7, as an example. The through-holes 22a are aligned in a row along the width direction of the housing 5, as an example. The exhaust port 22 is provided at a position away from the suction port 21. The exhaust port 22 is provided between the suction port 21 and the accommodation portion 50, as an example. The exhaust port 22 is provided at the lower side of a heat sink 32, which will be described later, so as to face the heat sink 32. The housing 5 has openings 60. The openings 60 are openings provided for exposing connectors 25, for example. The openings 60 are located at positions deviated from the lower portion of the fan 35. As an example, the openings 60 are provided to the peripheral wall 8.

As illustrated in FIG. 2, a rib 23 is provided to an inner surface 7a of the lower wall 7. The rib 23 is an example of a second protrusion. The rib 23 is located at a position different from the position of the accommodation portion 50. The rib 23 extends along the accommodation portion 50 (along the width direction of the housing 5) between the right wall 8d and the left wall 8c. The suction port 21 and the exhaust port 22 are provided between the rib 23 and the accommodation portion 50. The rib 23 is formed by a separate member from the lower wall 7, as an example, and is fixed to the inner surface 7a of the lower wall 7 with adhesion, welding, or the like.

A reinforcing member 24 (member, plate member) is provided to the lower wall 7. The reinforcing member 24 exhibits a plate-like outer appearance, as an example. The reinforcing member 24 is overlapped on the inner surface 7a of the lower wall 7 and is bonded (fixed) to the lower wall 7. The reinforcing member 24 can be bonded to the inner surface 7a by a bonding member such as a rivet and a screw, adhesion, welding, or the like. As an example, in the embodiment, the reinforcing member 24 adheres to the inner surface 7a in a state of being positioned by pins 7b standing on the inner surface 7a of the lower wall 7. The reinforcing member 24 reinforces the lower wall 7 of the housing 5 so as to suppress deformation of the housing 5 (lower wall 7) due to an external force. The reinforcing member 24 is provided between the accommodation portion 50 and the rib 23. The reinforcing member 24 is overlapped on the lower wall 7 around the suction port 21. The reinforcing member 24 surrounds the suction port 21. The reinforcing member 24 is made of a material comprising a higher Young's modulus than the material of the lower wall 7, as an example. As an example, the reinforcing member 24 can be made of stainless.

Figure 5:
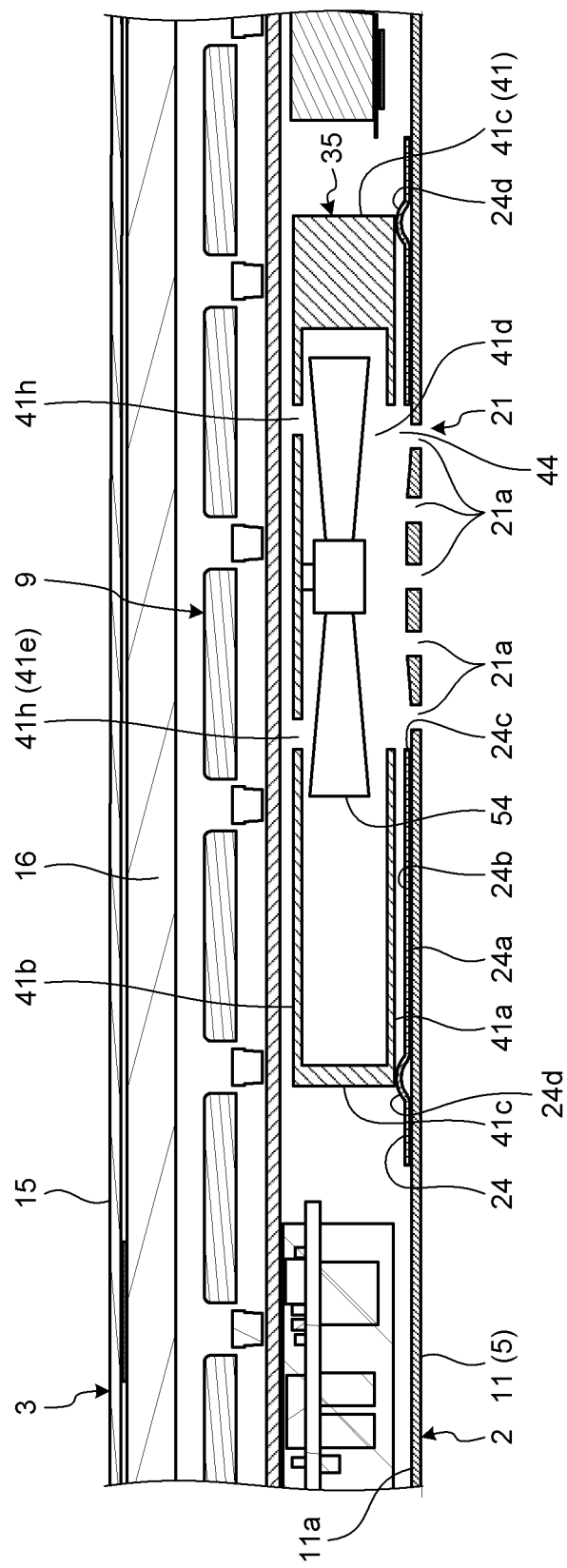
FIG. 5 is an exemplary sectional view illustrating an example of a part of the main body unit of the electronic device in the first embodiment.

As illustrated in FIG. 5, the reinforcing member 24 has surfaces 24a and 24b. The surfaces 24a and 24b have a front-rear relation. The surface 24a (first surface, lower surface) faces the inner surface 7a and the surface 24b (second surface, upper surface) is the surface opposite to the surface 24b.

As illustrated in FIG. 2 and FIG. 5, the reinforcing member 24 has an opening 24c. The opening 24c is an example of a second opening. The opening 24c is formed through the surfaces 24a and 24b. The opening 24c is overlapped with the suction port 21 and communicates with the suction port 21.

A part of the reinforcing member 24 is overlapped on the lower wall 7 between the suction port 21 and the exhaust port 22. In the embodiment, as illustrated in FIG. 2, the width W3 of the reinforcing member 24 in the direction orthogonal to the direction (direction of an arrow A in FIG. 2) connecting the suction port 21 and the exhaust port 22 is larger than the width W1 of the suction port 21 in the above-mentioned orthogonal direction and the width W2 of the exhaust port 22 in the above-mentioned orthogonal direction, as an example.

As illustrated in FIG. 2 and FIG. 5, the reinforcing member 24 is provided with a protrusion 24d. The protrusion 24d is an example of a first protrusion. The protrusion 24d is provided on the surface 24b of the reinforcing member 24. The protrusion 24d projects toward the fan 35. The protrusion 24d is formed to be elongated, as an example. One protrusion 24d is provided. The protrusion 24d is provided around the opening 24c so as to surround the opening 24c. The protrusion 24d exhibits a U-shaped outer appearance, as an example, and the opening 24c is located at the inner side of the U shape thereof. The protrusion 24d is located between the opening 24c and the rib 23. To be more specific, in the embodiment, a part of the protrusion 24d is located between the opening 24c and the rib 23.

As illustrated in FIG. 3, a plurality of leg portions 19 are provided to the lower wall 7 of the housing 5. The leg portions 19 make contact with the upper surface of the table, so that the lower wall 7 of the housing 5 is supported at a position separated from the upper surface of the table.

Figure 4:
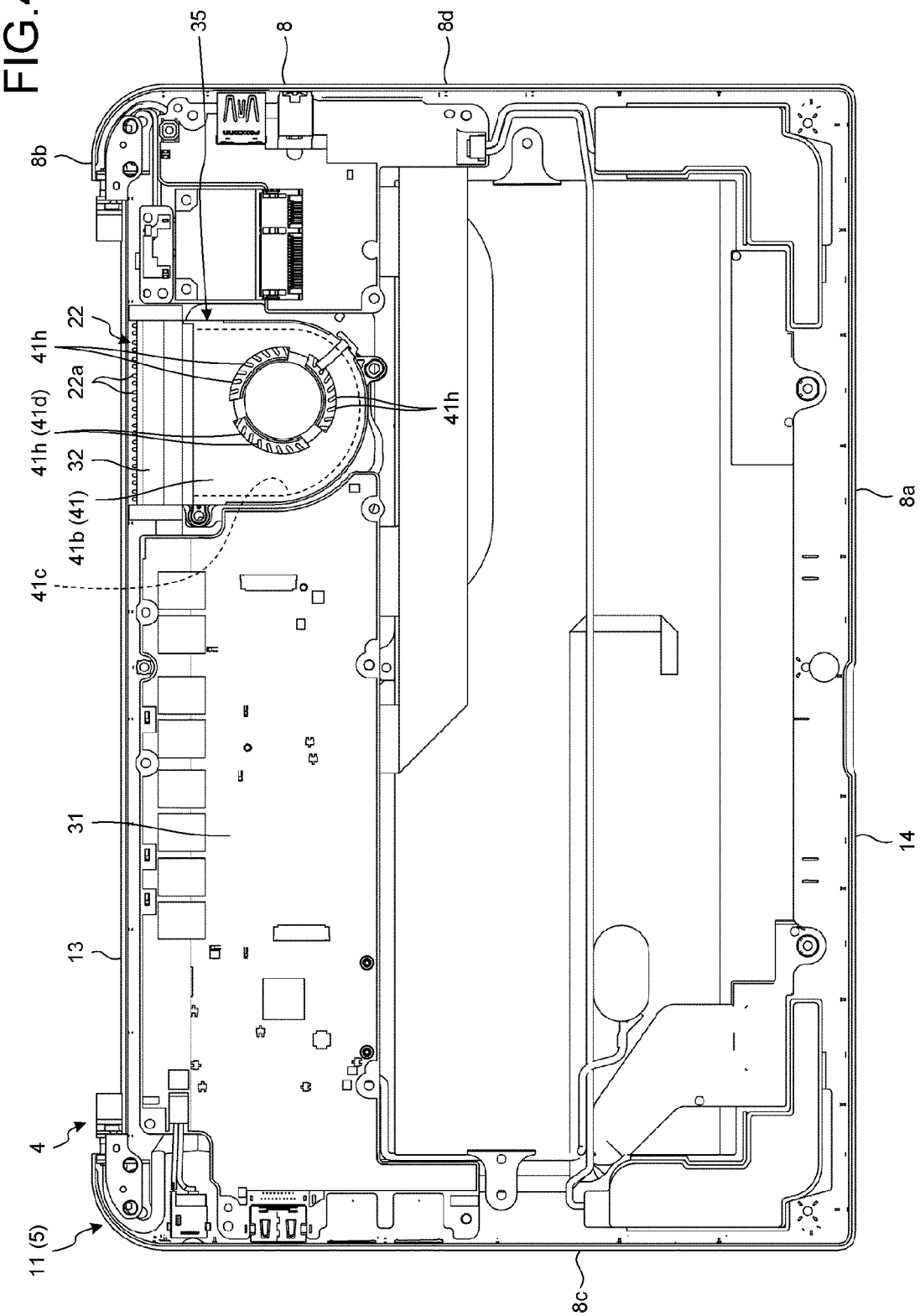
FIG. 4 is an exemplary plan view illustrating an example of an inner portion of the main body unit of the electronic device in the first embodiment.

As illustrated in FIG. 3 and FIG. 4, the housing 5 accommodates a circuit substrate 31, the heat sink 32, a heat pipe 33 (FIG. 3), a heat dissipation plate 34 (FIG. 3), and the fan 35. The fan 35 is an example of an electric component.

As illustrated in FIG. 3, the circuit substrate 31 is closer to the rear end portion 13 between the rear end portion 13 and the front end portion 14 of the housing 5, as an example. The circuit substrate 31 is located at the lower side of the keyboard 9, as an example. Components (electronic components, electric components) such as a central processing unit (CPU) 36, a memory slot connector 42, and a memory 43 are mounted on a mounting surface 31a (surface, upper surface) of the circuit substrate 31. The CPU 36 is an example of a heat generator and is a component (heat generation component) that generates heat at the highest level among the components of the circuit substrate 31.

The heat sink 32 is an example of a heat dissipator and is a fin unit comprising a plurality of fins, for example. The heat sink 32 is located on the rear end portion 13 of the housing 5 and faces the exhaust port 22 of the housing 5. The heat sink 32 is configured such that spaces between the fin and the fin direct to the exhaust port 22. The heat pipe 33 is connected to the heat sink 32. The heat sink 32 is accommodated in the housing 5 at a position facing the exhaust port 22.

The CPU 36 is connected to the heat sink 32 through the heat dissipation plate 34 and the heat pipe 33. The heat pipe 33 is an example of a heat transport member. The heat pipe 33 extends to the heat sink 32 from the CPU 36. The heat pipe 33 thermally connects the CPU 36 to the heat sink 32 and transports heat of the CPU 36 to the heat sink 32. That is, the heat pipe 33 connects the component and the heat sink 32. The heat dissipation plate 34 is a sheet-metal member, for example. The heat dissipation plate 34 faces the CPU 36 and is thermally connected to the CPU 36.

The fan 35 (cooling fan) is located away from the heat sink 32. The fan 35 is closer to the rear end portion 13 between the rear end portion 13 and the front end portion 14 of the housing 5, for example. The fan 35 is located at the lower side of the upper wall 6 and the keyboard 9. The fan 35 is fixed to the upper wall 6 by a fixing member such as a screw, as an example. The fan 35 is separated from the lower wall 7 and the reinforcing member 24 is located between the fan 35 and the lower wall 7.

The fan 35 is a centrifugal fan, as an example. As illustrated in FIG. 4 and FIG. 5, the fan 35 comprises a fan case 41 (case, housing) and an impeller 54 (FIG. 5) that is accommodated in the fan case 41 and is supported by the fan case 41 in a rotatable manner.

The fan case 41 has a lower wall 41a (wall, plate portion), an upper wall 41b (wall, plate portion), and a connecting wall 41c (wall, plate portion, peripheral wall). The lower wall 41a is an example of a second wall, the upper wall 41b is an example of a third wall, and the connecting wall 41c is an example of a fourth wall. The lower wall 41a is located at the side of the reinforcing member 24 that is opposite to the lower wall 7. The upper wall 41b is located at the side of the lower wall 41a that is opposite to the reinforcing member 24 and spaced from the lower wall 41a. The lower wall 41a and the upper wall 41b are provided so as to be substantially parallel with each other. The connecting wall 41c is provided between the lower wall 41a and the upper wall 41b so as to connect the lower wall 41a and the upper wall 41b. The connecting wall 41c is provided in a substantially U-shaped form in a planar view (FIG. 4).

The fan case 41 has a suction port 41d (FIG. 4), a suction port 41e (FIG. 5), and an exhaust port 41f (FIG. 3). The suction port 41d is provided to the lower wall 41a. The suction port 41d is overlapped on the opening 24c of the reinforcing member 24 and the suction port 21 to the lower wall 7 of the housing 5 and communicates with the opening 24c and the suction port 21. Furthermore, the suction port 41e is provided to the upper wall 41b. The suction port 41e is constituted by a plurality of through-holes 41h provided to the upper wall 41b. The exhaust port 41f is provided between the lower wall 41a and the upper wall 41b. In the embodiment, the exhaust port 41f is located at a portion at which the connecting wall 41c is not provided between the lower wall 41a and the upper wall 41b. The exhaust port 41f faces the heat sink 32.

The fan 35 rotationally drives the impeller 54 by a motor (driving source) so as to discharge the air sucked from the suction ports 41d and 41e from the exhaust port 41f. In addition, the outside air is sucked from the suction port 41d through the opening 24c of the reinforcing member 24 and the suction port 21 of the lower wall 7 of the housing 5. On the other hand, the air in the housing 5 is sucked from the suction port 41e. The air (outside air) that has been sucked from the suction port 41d and discharged from the exhaust port 41f is introduced to the heat sink 32. Accordingly, heat is released from the heat sink 32, so that the CPU 36 is cooled, as an example. When the air in the housing 5 is sucked from the suction port 41e, the outside air is sucked from the openings 60 of the housing 5, as an example. The suction and discharge operations cool a relatively wide range in the housing 5.

In the embodiment, the protrusion 24d of the reinforcing member 24 is provided at a position corresponding to the connecting wall 41c of the fan case 41. The protrusion 24d is provided so as to project toward the connecting wall 41c. The protrusion 24d is provided at a position overlapped with the connecting wall 41c in the facing direction (in the embodiment, up-down direction) of the lower wall 41a and the upper wall 41b of the fan case 41. The protrusion 24d and the fan case 41 may make contact with each other or may be separated from each other. The protrusion 24d guides the air between the lower wall 7 and the fan. As an example, the protrusion 24d constitutes a ventilation path 44 (flow path, FIG. 5) between the lower wall 7 and the fan 35. The air sucked from the suction port 41d is sucked into the fan case 41 from the suction port 41d through the ventilation path 44. In this case, the protrusion 24d prevents the air in the housing 5 from flowing into the ventilation path 44 (suction port 41d).

As described above, in the embodiment, the reinforcing member 24 is provided with the protrusion 24d projecting toward the connecting wall 41c of the fan case 41. According to the embodiment, when the external force is applied to the lower wall 7 of the housing 5 from the lower side, as an example, the protrusion 24d abutting the fan case 41 is shored between the lower wall 7 and the connecting wall 41c so as to suppress deformation of the housing 5 (lower wall 7). This makes it possible to prevent the external force from acting on the impeller 54, thereby operating the fan 35 preferably. The deformation of the housing 5 can be suppressed in this manner, so that the housing 5 can be made thinner.

In the embodiment, the reinforcing member 24 is provided with the protrusion 24d, so that the rigidity of the reinforcing member 24 is improved. According to the embodiment, a reinforcing function of the reinforcing member 24 is enhanced so as to suppress the deformation of the housing 5 (lower wall 7).

In the embodiment, the protrusion 24d is provided around the opening 24c. According to the embodiment, the peripheral edge portion of the opening 24c is reinforced by the protrusion 24d so as to suppress the deformation of the opening 24c, as an example.

In the embodiment, a part of the reinforcing member 24 is overlapped on the lower wall 7 between the suction port 21 and the exhaust port 22. According to the embodiment, the reinforcing member 24 can suppress deformation of the lower wall 7 between the suction port 21 and the exhaust port 22, as an example.

In the embodiment, the width W3 of the reinforcing member 24 is larger than the width W1 of the suction port 21 and the width W2 of the exhaust port 22. According to the embodiment, the reinforcing member 24 can suppress deformation of the lower wall 7 between the suction port 21 and the exhaust port 22 further, as an example.

In the embodiment, the protrusion 24d constitutes the ventilation path 44 between the lower wall 7 and the fan 35. According to the embodiment, the air sucked from the suction port 41d is preferably sucked into the fan case 41 from the suction port 41d through the ventilation path 44, as an example. In this case, the protrusion 24d prevents the air in the housing 5 from flowing into the ventilation path 44 (suction port 41d). This improves cooling efficiency of the heat sink 32 so as to cool the CPU 36 efficiently, as an example.

In the embodiment, the reinforcing member 24 is provided between the accommodation portion 50 and the rib 23. According to the embodiment, deformation of the lower wall 7 between the accommodation portion 50 and the rib 23 can be suppressed, as an example.

In the embodiment, the protrusion 24d is located between the opening 24c and the rib 23. According to the embodiment, deformation of the lower wall 7 between the opening 24c and the rib 23 can be suppressed, as an example.

In the embodiment, the material of the reinforcing member 24 has a higher Young's modulus than the material of the lower wall 7. According to the embodiment, the reinforcing member 24 can suppress deformation of the lower wall 7 efficiently, as an example.

Second Embodiment

Figure 6:
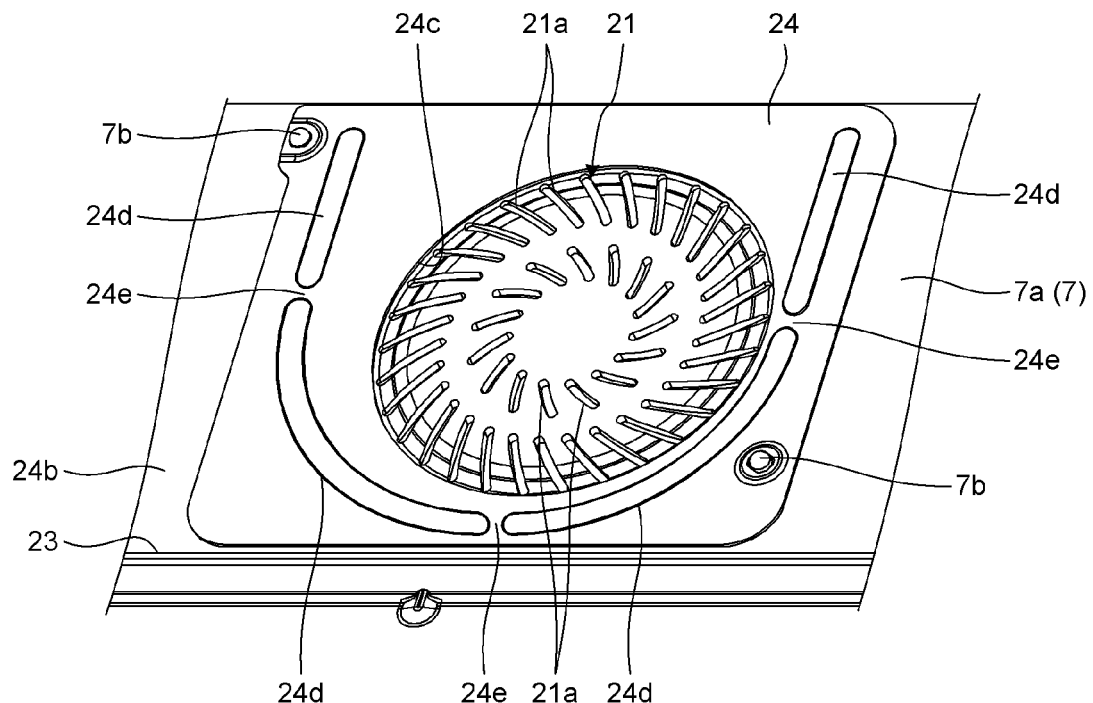
FIG. 6 is an exemplary perspective view illustrating an example of a part of the inner side of a lower wall of a main body unit of an electronic device according to a second embodiment.

As illustrated in FIG. 6, the embodiment is different from the first embodiment in the protrusion 24d of the reinforcing member 24. In the embodiment, a plurality of protrusions 24d are provided along the lower wall 7 so as to be spaced from one another. That is, openings 24e (spaces) are provided between the adjacent protrusions 24d. The protrusions 24d are located around the opening 24c. These protrusions 24d project toward the connecting wall 41c of the fan case 41 as in the first embodiment.

According to the embodiment, the protrusions 24d project toward the connecting wall 41c of the fan case 41 so as to suppress deformation of the housing 5 (lower wall 7) as in the first embodiment.

In the embodiment, the protrusions 24d are provided so as to be spaced from one another. According to the embodiment, the air is easy to be introduced into the housing 5 from the openings 24e between the adjacent protrusions 24d into the suction port 41e, as an example. According to the embodiment, a wide range in the housing 5 can be cooled.

Third Embodiment

Figure 7:
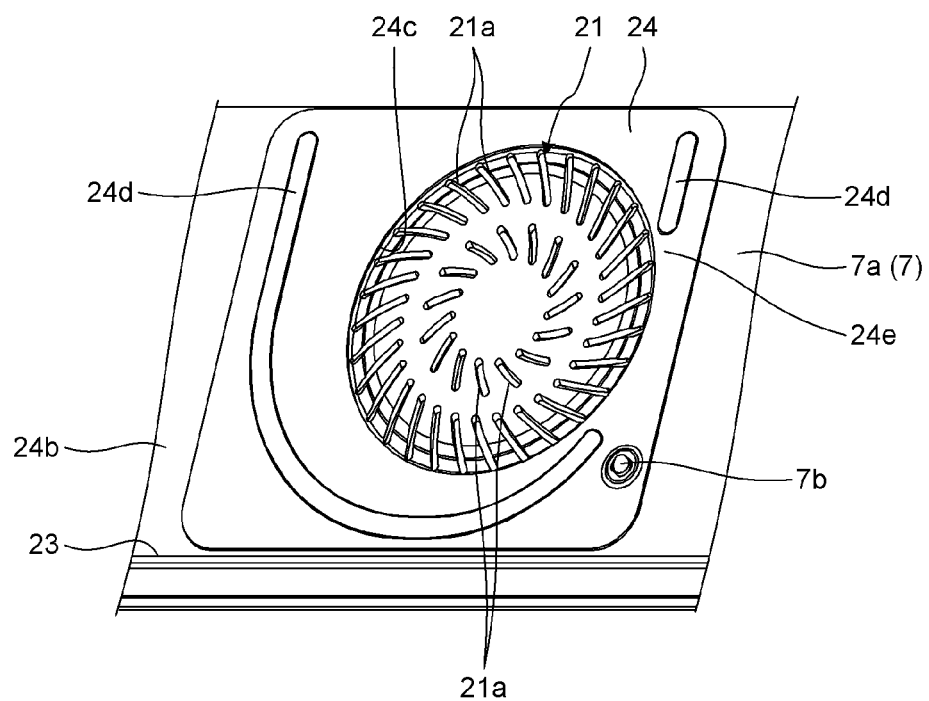
FIG. 7 is an exemplary perspective view illustrating an example of a part of the inner side of a lower wall of a main body unit of an electronic device according to a third embodiment.

As illustrated in FIG. 7, the embodiment is different from the first embodiment in the positions of the protrusion 24d and the opening 24c of the reinforcing member 24. In the embodiment, the protrusions 24d are provided along the lower wall 7 so as to be spaced from one another. That is, the opening 24e (space) is provided between the adjacent protrusions 24d. The protrusions 24d are located around the opening 24c. These protrusions 24d project toward the connecting wall 41c of the fan case 41 as in the first embodiment. Furthermore, a part of the opening 24c is located between the two adjacent protrusions 24d.

According to the embodiment, the protrusions 24d project toward the connecting wall 41c of the fan case 41 so as to suppress deformation of the housing 5 (lower wall 7) as in the first embodiment.

According to the embodiment, the protrusions 24d are provided so as to be spaced from one another, thereby cooling a wide range in the housing 5 as in the second embodiment.

In the embodiment, a part of the opening 24c is located between the two adjacent protrusions 24d. The air from the opening 24e between the protrusions 24d to the opening 24c flows more preferably.

As described above, according to the respective embodiments, deformation of the housing 5 can be suppressed when the housing 5 receives an external force.

Although some embodiments of the invention have been described, these embodiments have been proposed as examples and do not intend to limit the range of the invention. These novel embodiments can be executed in other various modes. Various omissions, replacements, and changes can be made in a range without departing from the scope of the invention. These embodiments and modifications thereof are encompassed in the range and the scope of the invention and are encompassed in the invention as described in the scope of the invention and equivalents thereof. For example, an electric component overlapped with the reinforcing member 24 is not limited to the fan 35 and may be a secondary battery, a hard disk drive (HDD) (storage device, or the like.

While certain embodiments have been described, these embodiments have been presented by way of example only, and are not intended to limit the scope of the inventions. The embodiments and modifications described herein may be embodied in a variety of other forms; furthermore, various omissions, substitutions and changes may be made without departing from the essentials of the inventions. The embodiments and modifications fall within the scope or essentials of the inventions and also fall within the inventions described in claims and their equivalents. Also, components can be partially replaced between the embodiments and the modifications. Also, specification of each component (structure, type, direction, shape, size, length, width, thickness, height, number, arrangement, position, material, and the like) can be appropriately modified. As an example, the stand may be configured such that the shaft (slider, protrusion portion) is provided in the movable portion (second support portion), and the groove (rail) movably guiding the shaft is provided in the base (base). Also, the stand may include an elastic member that elastically presses the second support portion in a predetermined direction. The accompanying claims and their equivalents are intended to cover such forms or modifications as would fall within the scope and spirit of the inventions.

What is claimed is:

1. An electronic device comprising:
   a first housing comprising a first wall;
   a reinforcing member that is overlapped on an inner surface of the first wall and is bonded to the first wall;
   an electric component comprising a second wall located at a side opposite to the first wall with respect to the reinforcing member, a third wall located at a side opposite to the reinforcing member with respect to the second wall and spaced from the second wall, and a fourth wall connecting the second wall and the third wall, the electric component being accommodated in the first housing, and
   a first protrusion that is provided to the reinforcing member and projects toward the fourth wall wherein the first protrusion contacting with the fourth wall is shored between the fourth wall and the first wall wherein the first wall comprises a first opening, the reinforcing member comprises a second opening overlapped with the first opening, and the first protrusion is provided around the second opening.

2. The electronic device of claim 1, wherein the first wall comprises a third opening at a position away from the first opening, and a part of the reinforcing member is overlapped on the first wall between the first opening and the third opening.

3. The electronic device of claim 2, wherein a width of the reinforcing member in a direction orthogonal to a direction connecting the first opening and the third opening is larger than a width of the first opening in the orthogonal direction and a width of the third opening in the orthogonal direction.

4. The electronic device of claim 1, wherein the electric component comprises a fan, the second opening comprises a suction port, and the first protrusion constitutes a ventilation path between the first wall and the electric component.

5. The electronic device of claim 4, wherein a plurality of first protrusions are provided along the second wall so as to be spaced from each other and are located around the second opening.

6. The electronic device of claim 5, wherein a part of the second opening is located between two adjacent ones of the first protrusions.

7. The electronic device of claim 1, further comprising: a second housing rotatably coupled to the first housing by a hinge, wherein the first housing comprises an accommodation portion accommodating the hinge, the first wall is provided with a part of the accommodation portion, an inner surface of the first wall is provided with a second protrusion at a position different from the accommodation portion, and the reinforcing member is provided between the accommodation portion and the second protrusion.

8. The electronic device of claim 7, wherein the first wall comprises a first opening between the accommodation portion and the second protrusion, the reinforcing member comprises a second opening overlapped with the first opening, and the first protrusion is located between the second opening and the second protrusion.

* * * * *